United States Patent [19]

King et al.

[11] Patent Number: 5,217,751
[45] Date of Patent: Jun. 8, 1993

[54] STABILIZED SPRAY DISPLACEMENT PLATING PROCESS

[75] Inventors: Randal D. King, Wilmington, Del.; Americus C. Vitale, West Chester, Pa.

[73] Assignee: McGean-Rohco, Inc., Cleveland, Ohio

[21] Appl. No.: 799,135

[22] Filed: Nov. 27, 1991

[51] Int. Cl.$^5$ .............................................. C23C 26/00
[52] U.S. Cl. ..................................... 427/98; 427/427; 427/433; 427/345
[58] Field of Search ................... 427/98, 96, 433, 427, 427/345

[56] References Cited

U.S. PATENT DOCUMENTS

| | | | |
|---|---|---|---|
| 2,891,871 | 6/1959 | Ceresa | 427/435 |
| 3,303,029 | 2/1967 | Shipley | 106/1.25 |
| 4,027,055 | 5/1977 | Schneble | 427/98 |
| 4,234,631 | 11/1980 | Davis | 427/98 |
| 4,657,632 | 4/1987 | Holtzman | 427/96 |
| 4,715,894 | 12/1987 | Holtzman | 106/1.25 |
| 4,790,912 | 12/1988 | Holtzmann | 427/96 |
| 4,882,202 | 11/1989 | Holtzman | 427/98 |
| 5,073,456 | 12/1991 | Palladino | 428/901 |

FOREIGN PATENT DOCUMENTS 515908  8/1955  Canada ............................. 427/433

*Primary Examiner*—Michael Lusigan
*Assistant Examiner*—V. Duong Dang
*Attorney, Agent, or Firm*—William P. Hauser; James A. Lucas

[57] ABSTRACT

An efficient spray displacement tin plating process of copper printed circuit innerlayers is disclosed for the manufacture of multilayer printed circuit boards. The displacement tin plating solution is stabilized and replenished by incorporating free tin metal in the plating solution reservoir. Unwanted tin(IV) ions which are produced by aerial oxidation during the spray process, are reacted with tin metal in the reservoir to produce sufficient tin(II) ions to compensate for losses due to plating, oxidation and the like. Not only is the plating bath stabilized, but its useful life is extended dramatically.

22 Claims, No Drawings

STABILIZED SPRAY DISPLACEMENT PLATING PROCESS

BACKGROUND OF THE INVENTION

This invention relates to the chemical displacement plating. More particularly, this invention relates to plating of tin on copper, copper alloys, and other metals by chemical displacement using a spray or cascade application process. Still more particularly, this invention relates to the use of such chemical displacement plating in the manufacture of printed circuit boards.

Coatings of tin typically have been applied to surfaces of copper and copper based alloys by a particular mode of displacement plating, i.e., immersion plating techniques such as disclosed in U.S. Pat. No. 2,891,871, U.S. Pat. No. 3,303,029 and U.S. Pat. No. 4,715,894. ("Displacement" plating has also been referred to as "replacement" plating and for the purpose of this invention the terms are intended to be synonymous.) In the disclosed immersion tin plating techniques, a bath is prepared containing an aqueous solution of a tin(II) salt, an acid, and thiourea or a thiourea derivative as essential ingredients. In the immersion tin plating process, an article bearing a copper surface, e.g., a copper clad printed circuit board, is immersed in the plating bath for a period of time during which the surface copper metal is oxidized to copper(I) ion and complexed with the thiourea and is replaced at the surface by the concurrently reduced tin metal from the tin(II) ion. After displacement plating has been completed to a desired thickness, the article is removed from the bath and is rinsed to remove residual plating solution. During the plating process the concentration of copper(I) thiourea complex in the immersion bath increases. Likewise, some aerial oxidation of tin(II) ion leads to increased tin(IV) ion concentration during the life of the plating bath. However, the concentrations of copper(I) complex and tin(IV) ion rapidly equilibrate due to the substantial drag-out of the plating solution with the plated article and the subsequent bath replenishment. The presence of tin(IV) ion in tin displacement plating is undesirable since it reduces the efficiency of the plating bath. Immersion plating baths typically have a very small surface-to-volume ratio which minimizes aerial oxidation and typically the equilibrium concentration of tin(IV) ion is within acceptable limits. Nevertheless, when plated surface thickness is critical, as in some printed circuit board applications, undesirable aerial oxidation during removal of the article from the immersion bath can result in streaks of non-uniform thickness in the plated surface.

Chemical displacement plating has been used in the manufacture of printed circuit boards (PCB's) and particularly multilayer printed circuit boards. Printed circuit boards (PCB's) comprise a non-conducting or dielectric such as a fiberglass/epoxy sheet which is clad with a metal conductive layer such as copper on either one or both surfaces. The metal layer on the PCB before processing typically is a continuous layer of copper which may be interrupted by a pattern of plated through holes or vias linking both surfaces of the board. During processing selected portions of the copper layer are removed to form a raised copper circuit image pattern of the PCB. Multilayer PCB's are typically constructed by interleaving imaged conductive layers such as one containing copper with dielectric adhesive layers such as a partially cured B-stage resin, i.e., a prepreg, into a multilayer sandwich which is then bonded together by applying heat and pressure. Production of these types of printed circuit boards are described in "Printed Circuits Handbook", Third Edition, edited by C. F. Coombs, Jr., McGraw-Hill, 1988, which is incorporated herein by reference. Since a conductive layer with a smooth copper surface does not bond well to the prepreg, several copper surface treatments have been developed to increase the bond strength between the layers of the multilayer PCB sandwich.

One such copper surface treatment is the use of immersion tin and tin alloys as a bonding medium for multilayer circuits as disclosed by Holtzman et al., U.S. Pat. No. 4,715,894. In the disclosed process an immersion tin composition is disclosed containing both thiourea compounds and urea compounds to displacement plate the copper surface of each PCB with tin by the immersion process prior to laminating them to form a multilayer board. Although bond strength of multilayer PCB's prepared by this immersion process was improved, the production efficiency of multilayer PCB's is limited by the batch process wherein substantial quantities of plating bath is lost through drag-out of the solution with each PCB processed. Moreover, the PCB's made by this immersion process are susceptible to defects due to streaking described supra.

Innerlayer bonding of multilayer PCB's has been further improved by the process disclosed in assignee's U.S. patent application, Ser. No. 07/446335, filed Dec. 5, 1989, now U.S. Pat. No. 5,073,456 and in a publication in "Printed Circuit Fabrication", Vol. 13, No. 5, pages 46–60, May 1990 by K. H. Dietz, J. V. Palladino and A. C. Vitale, entitled MULTILAYER BONDING: CURRENT TECHNOLOGY AND A NEW ALTERNATIVE. The in-line process disclosed includes a spray displacement tin plating step followed by a post-treatment step with a silane bonding mixture of a ureido silane and a disilyl crosslinking agent. In particular, PCB's are fed by conveyor through a series of treatment and rinse stations in which the PCB's are sequentially cleaned, microetched, spray tin displacement plated, post-treated with the silane bonding mixture and dried. The PCB's prepared by this spray tin displacement plating system are substantially free of streak defects observed in the immersion batch process and the multilayer PCB's prepared therefrom demonstrate improved resistance to delamination during typical high temperature soldering operations. During the plating process the plating solution is sprayed onto the PCB and the excess solution is recovered and returned to the plating bath sump with minimal drag-out to succeeding rinse stations. Although improved multilayer PCB's have been obtained by the disclosed process, it has now been observed that the activity of the plating bath solution declines during use due to the accumulation of tin(IV) ion formed by aerial oxidation of tin(II) during the spray application step. Concurrently, the concentration of copper(I) thiourea complex increases in the recirculated plating solution until its solubility limit is surpassed and crystalline complex is precipitated which clogs the spray nozzles and interferes with the mechanical components of the plating system. In order to take full advantage of the benefits of the spray tin displacement plating process, there is a need to stabilize the activity of the tin plating bath and eliminate the insoluble copper(I) thiourea complex precipitate and thereby extend the life of the plating bath with minimal replenishment.

SUMMARY OF THE INVENTION

The life of the displacement plating bath has been extended by the present invention which is a process for displacement plating a substrate metal surface with an other metal comprising the steps:

(a) providing a reservoir of aqueous plating solution comprising;
  (i) a free metal which is different from the metal of the substrate surface;
  (ii) a metal ion of the free metal (i), which is present in its lowest oxidation state;
  (iii) a complexing agent; and
  (iv) an acid;

(b) directing a stream of the aqueous plating solution onto the substrate metal surface; whereby a portion of the metal ions of (ii) are oxidized to ions in a higher oxidation state, and another portion of the metal ions of (ii) are reduced to free metal, wherein said reduced free metal displaces surface substrate metal which is oxidized to an ion and complexed with the complexing agent to form a substrate ion complex dissolved in the reacted aqueous displacement plating solution at the surface of the substrate metal; and (c) returning the plating solution to the reservoir whereby at least a portion of the metal ions present in their higher oxidation state are reacted with free metal (i) to form metal ions present in their lowest oxidation state to replenish the aqueous plating solution.

In step (c) of the process of the present invention, the portion of the formed metal ions present in their lowest oxidation state is twice the portion of the metal ions present in their higher oxidation state which reacted with the free metal (i). The extent of conversion of the metal ions present in their higher oxidation state to the formed metal ions present in their lowest oxidation state is controlled by the available surface area of the free metal (i) in the reservoir volume of the aqueous plating solution. In the process of the present invention, the ratio of the surface area of the free metal (i), to the volume of the aqueous plating solution typically is at least 4 in$^2$/gallon (6.8 cm$^2$/liter).

DETAILED DESCRIPTION OF THE INVENTION

The present invention is directed to the stabilization and replenishment of displacement plating processes in which the plating solution is sprayed, cascaded, poured onto or otherwise applied in the presence of air to the substrate surface to be plated. The present invention is also directed to the reduction of waste generated by such a plating process.

Displacement plating solutions are known and include immersion tin and tin alloy solutions such as disclosed in Holtzman et al., U.S. Pat. No. 4,715,894, which is incorporated herein by reference. The displacement metal plating process does not employ an electric current but is based on an electrochemical displacement reaction. The metal substrate that is to be plated generally is more active (less noble) than the metal salt that is dissolved in the coating composition or plating solution. Copper may be plated by tin solution even though copper is more noble than tin when the immersion coating composition is acidic and contains thiourea as a so-called complexing agent. It has been theorized that the relative electrode potentials of tin and copper are reversed in the presence of thiourea under acidic conditions. Once the metal substrate is completely coated, it is no longer available to displace the metal ions in the displacement coating composition. Metal ions contemplated for use in the present invention generally are simple cations of the metal salt, e.g., tin(II) and tin(IV) ions.

Displacement tin plating solutions are particularly susceptible to aerial oxidation. Consequently, application of such solutions typically has been limited to immersing or dipping substrates into the plating solution, thereby minimizing aerial oxidation of the plating bath. A spray displacement tin plating process for bonding multilayer printed circuit boards has been disclosed in Palladino, U.S. Pat. No. 5,073,456 (assignee's U.S. patent application, Ser. No. 07/446335, filed Dec. 5, 1989), and in a publication in "Printed Circuit Fabrication", Vol. 13, No. 5, pages 46-60, May 1990, by K. H. Dietz, J. V. Palladino and A. C. Vitale, entitled MULTILAYER BONDING: CURRENT TECHNOLOGY AND A NEW ALTERNATIVE, both of which are included herein by reference. Such an in-line spray process while having advantages over the batch immersion process, is particularly impacted by aerial oxidation and build up of by-products in the plating solution. The present invention is particularly directed to minimizing or eliminating such limiting effects on the spray displacement tin plating process.

The present invention will be described in the context of a spray displacement tin plating process particularly for the manufacture of multilayer printed circuit boards but it is not intended to be limited thereby. The multilayer printed circuit board has alternating layers of dielectric material which support copper circuitry (which may have interspaced other layers such as a copper sheet which serves as a ground plane) which are adhered to an insulating layer through intermediate layers. The circuit board has conductive through holes which form electrical paths across the entire thickness of the board.

In formation of multilayer circuit boards several dozen conductive and nonconductive layers can be employed. Also, for formation of multilayer circuit boards, it is necessary to drill holes and defects can occur due to delamination of layers in the areas immediately surrounding a hole. If a defect is present in one of the layers or if delamination occurs, generally the entire board must be scrapped. Therefore high quality in each of the steps of formation of the printed circuit board is essential for commercial production. One such step for forming high quality multilayer boards is the formation of defect free tin plating over the copper circuitry of each constituent board.

A starting material in the present invention is a dielectric layer which contains on one or opposite surfaces a cladding of copper. This copper layer is of a thickness of at least 4 microns and more preferably 32 microns and it is used to form conductive circuitry. Well known techniques can be employed to form such circuitry such as described in Coombs supra. The composition of the dielectric layer is not critical provided it functions as an electrical insulator. Preferably, a partially cured thermosetting polymer composition is employed which is known in the art as prepreg or "B" stage resin.

After formation of the conductive circuitry, it is necessary to form a thin outer layer of tin thereon. The circuitry of the printed circuit board typically is first cleaned and etched, such as disclosed in Palladino supra.

The cleaned and etched printed circuit board is then tin plated using the process of this invention which is a process for displacement plating a copper surface of a printed circuit board with tin or a tin alloy comprising the steps:

(a) providing a reservoir of aqueous displacement tin plating solution comprising;
   (i) free tin metal,
   (ii) tin(II) ion,
   (iii) a thiourea, and
   (iv) an acid;

wherein the ratio of the surface area of the free tin metal to the volume of the aqueous displacement tin plating solution is at least 4 in$^2$/gallon (6.8 cm$^2$/liter); (b) spraying a stream of the aqueous displacement tin plating solution from the reservoir onto the copper surface; whereby a portion of the tin(II) ion is aerially oxidized to a tin(IV) ion, and whereby the tin(II) ion is reduced to the free metal to displace surface copper which is oxidized to copper(I) ion and complexed with the thiourea to form a copper(I) thiourea complex dissolved in the reacted aqueous displacement tin plating solution at the surface of the copper; and (c) returning the sprayed and reacted aqueous displacement tin plating solution to the reservoir so that the portion of the tin(IV) ion formed is reacted with the surface of the free tin to form twice the portion of tin(II) ion, so that the aqueous displacement tin plating solution of step (a) is replenished with the portion of the tin(II) ion formed. The aqueous displacement tin plating solution may contain additional components such as urea, reducing agents, surfactants and the like as disclosed in Holtzman et al. supra and Palladino supra. When a tin alloy is to be plated, a salt of a second metal such as lead, is present in the solution. In a preferred embodiment the aqueous displacement tin plating solution contain a thiourea compound, a tin(II) salt, a reducing agent, an acid and a urea compound.

The tin(II) salts of an inorganic (mineral) acid such as the sulfur, phosphorous and halogen acids may be used or organic acid may be used (e.g., tin(II) formate, tin(II) acetate and the like). Preferred are the tin(II) salts of the sulfur acids such as sulfuric acid and sulfamic acid. Alkali metal stannates may also be used such as sodium or potassium stannate and the known equivalents thereof. Where tin/lead alloy coatings are deposited, lead acetate may be used as the lead salt.

The thiourea compounds that are used may be either thiourea or the various art known derivatives, homologous, or analogs thereof such as disclosed in columns 11 and 12 of Holtzman et al., U.S. Pat. No. 4,715,894 which has been incorporated herein by reference supra. Thiourea is preferred.

Free tin metal may be present in the aqueous displacement tin plating solution in any form, e.g., extruded tin, "mossy" tin, cast tin, and the like. Extruded tin, such as the tin slabs conventionally used as electrolytic anodes or tin wire, is preferred since the amount needed to control stabilization of the solution is easily adjusted by removing or adding portions of the tin to achieve the desired surface to volume ratio. The ratio of the tin surface to the volume of the aqueous displacement tin plating solution typically will be at least about 4 in$^2$/gallon (6.8 cm$^2$/liter) and preferable about 16 in$^2$/gallon (27.2 cm$^2$/liter) or greater.

The acids that are used may be organic acids or inorganic acids (mineral acids) based on sulfur, phosphorous, the halogens, or the mixtures thereof, the sulfur based mineral acids being preferred such as sulfuric acid and sulfamic acid. Particularly preferred is the mixture of sulfuric acid and hypophosphorous acid. Some of the organic acids that may be used comprise monocarboxylic or dicarboxylic acids having up to about six carbon atoms such as formic acid, acetic acid, malic acid, maleic acid, and the like.

It is preferred, if possible, not to use halogen acids or halogen salts since halide residues will be produced in the tin coating deposited. Halide salts interfere with electrical properties of the tin and may also act as corrosive materials in the coating.

The urea compound that may be used may be either urea or the various art known derivatives, homologes, or analogs thereof such as disclosed in columns 12 through 15 of Holtzman et al., U.S. Pat. No. 4,715,894 which has been incorporated herein by reference supra. Urea is preferred.

Chelating agents that may be used generally comprise the various classes of chelating agents and specific compounds disclosed in Kirk-Othmer, Encyclopedia of Chemical Technology, Third Edition, Volume 5, pages 339-368 incorporated herein by reference. Chelating agents that are especially preferred comprise aminocarboxylic acids and hydroxycarboxylic acids. Some aminocarboxylic acids that may be used comprise ethylenediaminetetraacetic acid, hydroxyethylethylenediaminetriacetic acid, nitrilotriacetic acid, N-dihydroxyethylglycine, and ethylenebis(hydroxyphenylglycine). Hydroxy carboxylic acids that may be used comprise tartaric acid, citric acid, gluconic acid and 5-sulfosalicylic acid.

The various reducing agents that may be used are well known in the art and generally comprise organic aldehyde whether saturated or unsaturated, aliphatic or cyclic, having up to about ten carbon atoms. Lower alkyl aldehydes having up to about six carbon atoms may be employed in this respect such as formaldehyde, acetaldehyde, propionaldehyde, butyraldehyde, and the like. Especially preferred aldehydes comprise hydroxy aliphatic aldehydes such as glyceraldehyde, erythrose, threose, arabinose and the various position isomers thereof, and glucose and the various position isomers thereof. Glucose has been found to act to prevent oxidation of the metal salts to a higher oxidation state, e.g., tin(II) to tin(IV), but also as a chelating agent and is especially useful for these reasons.

The surfactants that may be used comprise any nonionic, anionic, cationic or amphoteric surfactant such as those listed in Kirk-Othmer, Encyclopedia of Chemical Technology, Third Edition, Volume 22, pages 332-387 incorporated herein by reference. The nonionic surfactants are especially preferred.

The various components of the aqueous displacement plating solution may be present at conventionally established concentrations. Typically, the displacement plating solution will contain on a molar basis:

about 1 to about 15 parts of the displacement metal ion;

about 10 to about 125 parts of a thiourea compound; and about 1 to about 360 parts of an acid. The solution may also contain on a molar basis;

about 10 to about 125 parts of a urea compound;

about 5 to about 40 parts of a chelating agent; and about 5 to about 110 parts of a reducing agent. The solution concentrations may, of course, vary depending on the particular plating application intended.

In an invention of Assignees copending U.S. patent application, U.S. Ser. No. 07/799,134, filed of even date, the precipitation of substrate metal ion complex in the reservoir is prevented by the added process wherein, after a period of plating use during which the concentration of the substrate metal ion complex in the plating solution reaches a high level which is below the concentration at which the substrate metal ion complex precipitate is formed, the following steps are added:

(d) withdrawing a portion of the volume of the aqueous plating solution from the reservoir;

(e) cooling the withdrawn portion to a temperature at which the substrate metal ion complex is insoluble and the complexing agent is soluble so that the substrate metal ion complex precipitates from the solution;

(f) removing the substrate metal ion complex precipitate from the solution;

(g) returning the solution to the reservoir; and (h) repeating steps (d) through (g) a sufficient number of times until the concentration of the substrate metal ion complex in the plating solution drops to a predetermined low level. The solution at this point may need to be replenished with thiourea before it is recirculated for reuse.

In the context of the spray displacement tin plating process, as the concentration of copper(I) thiourea increases in the aqueous displacement tin plating solution, precipitation of the complex is prevented by the added process wherein, after a period of plating use during which the concentration of the copper(I) thiourea complex in the aqueous displacement tin plating solution reaches a high level which is below the concentration at which the copper(I) thiourea complex precipitate is formed, e.g., between 85% and 95% of the saturation concentration of the complex, the following steps are added to the process described supra:

(d) withdrawing a portion of the volume, e.g., 5% to 20% of the volume, of the aqueous displacement tin plating solution from the reservoir;

(e) cooling the withdrawn portion to a temperature at which the copper(I) thiourea complex is insoluble and the thiourea is soluble so that the copper(I) thiourea complex precipitates from the solution;

(f) removing the copper(I) thiourea complex precipitate from the solution, e.g., by filtering, centrifuging or the like;

(g) returning the solution to the reservoir; and (h) repeating steps (d) through (g) a sufficient number of times, e.g., three or four times, until the concentration of the copper(I) thiourea complex in the aqueous displacement tin plating solution drops to a predetermined low level, e.g., about 80% of the saturation concentration of the complex. The solution at this point may need to be replenished with thiourea before it is recirculated for reuse. The precipitated copper(I) thiourea complex produced by this process may be disposed of using conventional waste-treatment processes such as that disclosed by Dietz et al. supra. Since thiourea is an objectionable waste, a waste-treatment process using hydrogen peroxide was developed for its treatment to reduce concentrations to less than 1 ppm.

In an embodiment of the invention of Assignees copending U.S. patent application, U.S. Ser. No. 07/799,134, filed of even date, the substrate metal or its alloy is reclaimed from its ion complex and the freed complexing agent is recycled into the plating solution by the added process wherein the following steps are added:

(j) dissolving the removed substrate metal ion complex precipitate in an aqueous acid solution to form a redissolved substrate metal ion complex solution;

(k) electroplating the substrate metal onto a cathode from the redissolved substrate metal ion complex solution contained in an electrolytic cell having the cathode and an anode, to reform the complexing agent in the aqueous acid solution, wherein the electrolytic cell is configured so that the reformed complexing agent is isolated from the anode; and (l) replenishing the aqueous plating solution of step (a) with the aqueous acid solution containing the reformed complexing agent.

In the context of the spray displacement tin plating process, the copper or its tin alloy may be reclaimed from precipitated copper(I) thiourea complex and the freed thiourea may be recycled to replenish the aqueous displacement tin plating solution by the added process wherein the following steps are added: (j) dissolving the removed copper(I) thiourea complex precipitate in an aqueous acid solution to form a redissolved copper(I) thiourea complex solution wherein the acid is the same acid (iv) as in the aqueous displacement tin plating solution; (k) electroplating the copper onto a cathode from the redissolved copper(I) thiourea complex solution contained in an electrolytic cell having the cathode and an anode, to reform the thiourea in the aqueous acid solution, wherein the electrolytic cell is configured so that the reformed thiourea is isolated from the anode, e.g., by a salt bridge, semipermeable membrane or the like; and (l) replenishing the aqueous displacement tin plating solution of step (a) with the aqueous acid solution containing the reformed thiourea. The spray displacement tin plating process described by these added steps is virtually a closed loop plating system with a very long plating solution life. The displacement tin plating solution is substantially replenished by the quantity of free tin metal added, i.e., the tin surface area in the solution, and the strength of the acid solution used to dissolve the complex precipitate. The only substantial by-product would be the electrowinned copper alloy (bronze) with little or no waste treatment needed for rinse water.

In an alternate embodiment of the invention of Assignees copending U.S. patent application, U.S. Ser. No. 07/799,134, filed of even date, the substrate metal is reclaimed from the ion complex and the resulting complexing agent is oxidized for disposal as an acid waste by an electrowinning process wherein the following steps are added:

(j) dissolving the removed substrate metal ion complex precipitate in an aqueous acid solution to form a redissolved substrate metal ion complex solution;

(m) electroplating the substrate metal onto a cathode of an electrolytic cell containing the cathode and an anode, from the redissolved substrate metal ion complex solution contained therein to reform the complexing agent whereby the reformed complexing agent is oxidized at the anode to form an acid solution of the oxidized components of the complexing agent; and (n) disposing of the acid solution of the oxidized components of the complexing agent.

In the context of the spray displacement tin plating process, an alternate process to the disposal of the copper(I) thiourea complex precipitate formed in step (f)

above is an electrowinning process wherein the following steps are added after step (g): (j) dissolving the removed copper(I) thiourea complex precipitate in an aqueous acid solution to form a redissolved copper(I) thiourea complex solution; (m) electroplating the copper onto a cathode of an electrolytic cell containing the cathode and an anode, from the redissolved copper(I) thiourea complex solution contained therein to reform the thiourea so that the reformed thiourea is oxidized at the anode to form an acid solution of the oxidized components of the thiourea; and (n) disposing of the acid solution of the oxidized components of the thiourea. By this process, the displacement tin plating solution is partially replenished by the quantity of free tin metal added, i.e., the tin surface area in the solution and additional acid thiourea solution would be needed to complete the replenishment. Also by this process, the copper or copper alloy (bronze) is reclaimed from the copper(I) thiourea complex and the resulting thiourea is oxidized for disposal as an acid waste by conventional waste treatment procedures. In the process for the manufacture of multilayer circuit boards, the tin coated copper circuitry of each component circuit board is further treated to form a thin layer of an oxide, hydroxide or combination thereof on the surface of the tin in order to improve the bonding to the interleaved dielectric layers. Preferably, the treated tin surface is further treated with a silane bonding mixture to further improve bonding of the component layers of the multilayer circuit board during throughout its manufacture and end use life. The silane bonding mixture is a mixture of a ureido silane and a disilyl crosslinking agent which was disclosed in Palladino supra.

In addition to its use in the manufacture of multilayer printed circuit boards described supra, the stabilized spray displacement plating process of this invention may be used in other plating applications, e.g., as an etch resist in the manufacture of printed circuit boards. In the plate-and-etch method of circuit board manufacture, a polymeric or resin resist image is first formed on a copper clad circuit board substrate and then a metal resistant to etchants is plated on the copper surface areas not protected by the polymer resist image to form a complimentary metal resist image. The polymer resist image is then stripped from the copper surface and the uncovered copper not protected by the metal resist image is removed from the substrate by an etchant to form the printed circuit. The use of immersion tin coatings as an etch resist in the plate-and-etch process is disclosed in Holtzman et al., U.S. Pat. No. 4,657,632 which is incorporated herein by reference, wherein an etch resist immersion tin composition is selectively applied to the metal layer to leave areas of coated and uncoated metal followed by etching the metal not coated with the resist. In the disclosed process, immersion tin composition is applied as a substantially pore free coating at thicknesses from about 0.08 to about 0.175 microns. Holtzman et al., '632, further discloses that such immersion tin coatings overcome deficiencies in conventional electroplated tin-lead resists during subsequent soldering operations. In the conventional soldering operation, a solder mask is first applied to the printed circuit board to cover all board areas except where components are to be soldered thereto. Prior to the application of the solder mask the electrolytically deposited tin-lead etch resist on the circuit is removed by reflowing it at elevated temperatures and since the removal is not always uniform the circuit board sometimes has to be subjected to a leveling process. Such a leveling process comprises passing the board over a hot air knife, i.e., a constricted elongated hot air jet. Holtzman et al., '632, disclose that when immersion tin coatings are used as the resist, the reflow and hot air leveling steps can be eliminated.

The stabilized spray displacement plating process of this invention and its equivalents described supra may be used to produce superior etching resists for the plate-and-etch manufacture of circuit boards. When used to produce an etching resist, the aqueous displacement plating solution of this invention, will contain a water soluble salt of the displacement metal ion present in its lowest oxidation state. Such metal salts comprise those based on metals of group IVA; VB; VIB; VIIB; IB; IIB and IIIA of the Periodic Table of the Elements; The group IVA, VIII, IB, IIB, and IIIA metals being preferred; and the group IVA, VIII, and IB metals being especially preferred. Preferred metals which fall into this class are tin, lead, mercury, nickel, gold, silver, indium, germanium and palladium. The anions of these metal salts are the same as those defined herein for the tin salts. Particularly preferred are tin and various combinations of tin and other metals such as tin-lead, tin-nickel, tin-mercury and the like. Additionally, the metal salts as defined above and herein are typically employed in their lowest oxidation states, e.g., stannous tin(II); nickelous Ni(II); mercurous Hg(I); aurous Au(I) and the like. In one embodiment it is preferred to employ tin in its lowest oxidation state whereas any of the other metal salts may be employed in any oxidation state. Various mixtures of these other metal salts may also be employed. Salts of germanium, lead, mercury, silver, indium, gold and palladium are especially suitable.

In the instance when a solder mask is to be applied to a printed circuit substrate, displacement plating of the copper printed circuit may be deferred until after the solder mask has been applied, or displacement plating may be repeated prior to the soldering operation. Such deferral or repetition can improve the solder wetability of the plated connection sites during assembly and soldering of components to the circuit.

The stabilized displacement plating process of this invention will now be illustrated by the following examples but is not intended to be limited thereby.

EXAMPLE 1

Innerlayers for the manufacture of multilayer printed circuit boards were chemically cleaned, treated with a displacement tin composition and a silane bonding mixture in an in-line, conveyorized, spray treatment system such as disclosed in Palladino supra and in Dietz et al. supra.

The in-line spray system used to prepare the innerlayer panel surfaces had a conveyor speed of 4 feet per minute and contained the following process steps and conditions.

|   | Conveyor Length | Rinse Solution) | | Spray Pressure (PSI) |
|---|---|---|---|---|
|   |   | Water Flow | Temp. (°F.) |   |
| 1. Panel Feed (Input) | 23" | — | — | — |
| 2. Alkaline Cleaner | 20" | — | 120 | 25 |
| 3. Double CC Rinse | 20" | — | 60 | 20 |
| 4. Microetch | 38" | — | 85 | 25 |
| 5. Triple CC Rinse[b] | 30" | 4 GPM[c] | 60 | 20 |
| 6. Displacement Tin | 48" | — | 75 | 25 |

-continued

| | Conveyor Length | Rinse Solution) Water Flow | Temp. (°F.) | Spray Pressure (PSI) |
|---|---|---|---|---|
| Application | | | | |
| 7. Triple CC Rinse[d] | 30" | 4 GPM[c] | 110 | 25 |
| 8. Air Knife Drying | 13" | — | 105 | — |
| 9. Silane Treatment | 20" | — | 75 | 25 |
| 10. Hot Air Dryer | 30" | — | 130 | — |
| 11. Output Conveyor | 41" | — | — | — |

[a]Double CC Rinse (the term "CC" means counter current) is a two stage rinse wherein the last stage is fed by the acidic effluent of the Triple CC rinse of Step 5, the first stage is fed by the effluent of the last stage and the effluent of the first stage is discarded.
[b]Triple CC Rinse is a three stage rinse wherein the last stage is fed by a high quality water source, e.g., softened water, the second stage is fed by the effluent of the last stage, the first stage is fed by the effluent of the second stage and the acidic effluent of the first stage is fed to the the double CC rinse of Step 3.
[c]GPM is gallons per minute.
[d]Triple CC Rinse is a three stage rinse wherein the last stage is fed by deionized water, the second stage is fed by the effluent of the last stage, the first stage is fed by the effluent of the second stage and the effluent of the first stage is discarded.

The alkaline cleaner used in the system was Versa-CLEANR 415 (Du Pont) and the microetch was SureETCHR 550 (Du Pont) potassium peroxy monosulfate/sulfuric acid.

In Step 6 the displacement tin composition was formed by mixing Solution A and Solution B of the following compositions:

| Solution A | |
|---|---|
| D.I. Water | 200 ml |
| Conc. H2S04 | 100 ml |
| Hypophosphorus acid (50%) | 40 ml |
| tin(II) sulfate | 20 gms |
| D.I. Water | To 0.5 liter |
| Solution B | |
| Thiourea | 60 gms |
| Urea | 40 gms |
| D.I. Water | To 0.5 liter |

Sufficient solution was prepared to adequately fill the system reservoir.

In Step 9 the silane treatment solution was prepared by adding 60 ml of glacial acetic acid to 151 liters (40 gallons) of D.I. (deionized) water. 0.83% by solution weight (1571 grams) of gamma-ureidopropyltriethoxysilane coupling agent in methanol (50%) (A-1160 Union Carbide) and 0.17% by solution weight (322 grams) of 1,2-bis(trimethoxysilyl)ethane was then added followed by sufficient deionized water to produce 189 liters (50 gallons) of solution. The solution was then mixed by activating the recirculating system of the silane treatment spray module. The solution was allowed to mix for 15 to 20 minutes to insure complete hydrolysis of the organosilane to an organosilane-triol.

The concentration of tin(II) ion in the spray displacement tin solution was monitored during use by employing the following analytical procedure:
b 1. Withdraw 10 ml of the displacement tin solution from the reservoir of the spray system and dilute it to 100 ml with deionized water.
2. Add 10 ml of a buffer solution prepared from 40.6 g potassium acetate, 10 ml glacial acetic acid, and 212 ml deionized water.
3. Adjust the solution pH to 4 with a 50% solution of sodium hydroxide and add 10 drops of 10 g/L methyl thymol blue indicator solution.
4. Titrate the solution with 0.05 M EDTA (ethylenediamine-tetraacetic acid) solution to the end point which is a blue to yellow color shift, e.g., deep blue to lighter brownishorange. The tin(II) ion concentration in grams per liter is equal to the ml of the EDTA solution used times 0.7, i.e., $[Sn(II)] = 0.7 \times ml$ EDTA.

The freshly prepared displacement tin solution has a tin(II) ion concentration of about 11 g/L but during use in the spray plating process the tin(II) ion concentration and plating activity drops due to its removal as plated tin and to aerial oxidation to tin(IV) ions. Normal replenishment procedures could be employed to raise the tin(II) ion concentration but are ineffective in maintaining the plating efficiency at the high activity level needed for a commercial process. The activity level should be sufficiently high so that plated boards are substantially defect free. Since there is minimum "dragover", i.e., removal of plating solution along with the board during transition into the rinse cycle of the system, aerial oxidation products accumulate in the reservoir. The displacement tin solution typically is discarded when the tin(II) ion can no longer be maintained above 2.0 g/L.

The rate of aerial oxidation of tin(II) ion to tin(IV) ion is controlled by the amount of agitation created during the spray process and thereby is equipment dependent. Using existing equipment, the rate of tin(II) ion oxidation varies from 0.2 to 1.0 g/L per hour during spray agitation.

A freshly prepared displacement plating solution was used until the tin(II) ion concentration reached a level of about 5 g/L. At this point, 12 extruded tin slabs (of the type conventionally used as electrolytic anodes) having a total surface area of 12 square feet were placed in the reservoir of the displacement tin solution and the concentration of tin(II) ion was monitored over a period of two months of normal plating use. After approximately two weeks, the concentration of tin(II) ion stabilized at about 8.0 g/L and during the two month period, the surfaces of the tin slabs were etched away. The innerlayers prepared during this two month period passed AOI inspection immediately before they were layed-up in the manufacture of multilayer boards. During this time the multilayer boards produced continued to pass production qualification criteria, including thermal stress, humidity, pink ring, and adhesion testing criteria.

EXAMPLE 2

When the spray displacement plating process described in Example 1 was used over a prolonged period of time, crystals formed in the plating bath reservoir which clogged the spray nozzles and interfered with the mechanical components of the conveyor system. At this juncture the plating bath was discarded and the system cleaned and charged with fresh plating solution. The crystals were isolated and determined to be a copper(I) thiourea complex.

The same displacement tin plating process as described in Example 1 was carried out except that soluble copper(I) thiourea complex was removed from the plating bath using the following procedure:

When the concentration of the copper(I) thiourea complex in the plating bath solution reached about 80% to 95% of its saturation concentration;
1. 10 gallons of plating bath solution was removed from the reservoir, i.e., about 6.5% of the reservoir volume.
2. The solution which was removed was cooled to 55° F.,+/−3° F. and held at that temperature for about 10 minutes to selectively form copper(I) thiourea complex crystals.

3. The crystals formed were removed from the solution by pumping the solution through an in-line cartridge filter system which removes particles above 5 microns. The supernatant solution was fed back into the plating bath reservoir.

4. Steps 1 through 3 were repeated 4 times using the same cooling/filtering system; (At this juncture of the process the concentration of the copper(I) thiourea complex in the plating bath had dropped to about 80% or lower.)

5. 5 gallons of 10% sulfuric acid solution at 115° F.+/−5° F. was circulated through the cooling-/filtering system to dissolve the crystals precipitated in Steps 1 through 4; and 6. The 10% acid solution resulting from Step 5 was disposed of by a conventional waste treatment process for thiourea, copper and acid wastes. By the removal of excess copper(I) thiourea complex using this process, the useful life of the displacement tin plating solution was more than doubled while all multilayer boards which were prepared with the plating solution passed production qualification criteria.

EXAMPLE 3

This example demonstrates that a dilute acid solution of thiourea can be recovered from the 10% acid solution resulting from Step 5 of Example 2, which may then be used to partially replenish the displacement tin plating solution.

A 10% sulfuric acid solution, containing the copper-thiourea sulfate salt, was placed in a two cell electrochemical cell with a fine glass frit separating the two chambers. In one chamber was placed 30 cm of 1 mm Pt wire (working electrode) and a Ag/AgCl reference electrode, and in the second chamber, 30 cm of 1 mm Pt wire (counter electrode). The reference electrode provides a stable reference potential to insure the applied voltage does not drift.

Bulk electrolysis (electrowinning) was conducted on the dilute acid solution containing the salt using an overvoltage of 200 mV. Once the current dropped to the background level the electrolysis was stopped. The thiourea concentration in the acid solution dropped to about 75% of its initial concentration as determined spectrophotometrically by the absorbance at 236 microns which is assigned to thiourea. The copper concentration was measured by atomic absorption analysis and dropped from 60 ppm to below 10 ppm.

This method would allow the recovery ( from the working electrode chamber) and reintroduction of the dilute acid/thiourea solution back into the displacement tin plating reservoir, while recovering copper in a recyclable form. The dilution caused by the extra 5 gallons of dilute acid in which the thiourea remains dissolved, would compensate for normal evaporative water loss from the plating solution.

EXAMPLE 4

This example discloses an alternate process for disposing of the thiourea and copper wastes from the 10% acid solution resulting from Step 5 of Example 2.

A 10% sulfuric acid solution, containing the copper-thiourea sulfate salt, was placed in a single chamber electrochemical cell. Into the chamber was placed 30 cm of 1 mm Pt wire as a working electrode, a Ag/AgCl reference electrode, and 30 cm of 1 mm Pt wire as a counter electrode. The reference electrode provides a stable reference potential to insure the applied voltage does not drift.

Bulk electrolysis (electrowinning) was conducted on the dilute acid solution containing 3.0 g/L of the salt using an overvoltage of 200 mV. Once the current dropped to the background level the electrolysis was stopped. The thiourea concentration in the acid solution dropped to substantially zero as determined spectrophotometrically by the absence of absorbance at 236 microns which is assigned to thiourea. The copper concentration was measured by atomic absorption analysis to be below 10 ppm. Placing the working and counter electrodes in the same chamber, and performing bulk electrolysis on the solution resulted in the substantially complete oxidation of the thiourea at the counter electrode.

This process allows the removal of copper in a recyclable form along with complete oxidation of thiourea to provide a solution which can be disposed of by conventional acid waste practices.

What is claimed is:

1. A process for displacement plating a substrate metal surface with an other metal comprising the steps:
    (a) providing a reservoir of aqueous plating solution comprising;
        (i) a free metal which is different from the metal of the substrate surface;
        (ii) a metal ion of the free metal (i), which is present in its lowest oxidation state;
        (iii) a complexing agent; and
        (iv) an acid;
    (b) directing a stream of the aqueous plating solution onto the substrate metal surface; whereby a portion of the metal ions of (ii) are oxidized to ions in a higher oxidation state, and another portion of the metal ions of (ii) are reduced to free metal, wherein said reduced free metal displaces surface substrate metal which is oxidized to an ion and complexed with the complexing agent to form a substrate ion complex dissolved in the reacted aqueous displacement plating solution at the surface of the substrate metal; and
    (c) returning the plating solution to the reservoir whereby at least a portion of the metal ions present in their higher oxidation state are reacted with free metal (i) to form metal ions present in their lowest oxidation state to replenish the aqueous plating solution.

2. The process of claim 1 wherein the ratio of the surface area of the free metal (i), to the volume of the aqueous plating solution is at least 4 in$^2$/gallon (6.8 cm$^2$/liter).

3. The process of claim 1 wherein in step (c), the portion of the formed metal ions present in their lowest oxidation state is twice the portion of the metal ions present in their higher oxidation state which reacted with the free metal (i).

4. The process of claim 1 wherein the substrate metal surface is copper or a copper alloy.

5. The process of claim 1 wherein the free metal (i) is a metal of group IVA; VB; VIB; VIIB; VIII IB; IIB and IIIA of the Periodic Table of the Elements.

6. The process of claim 5 wherein the free metal (i) is taken from the group consisting of tin, lead, mercury, nickel, gold, silver, indium, germanium, palladium, and mixtures thereof.

7. The process of claim 1 wherein the metal ion present in its lowest oxidation state (ii) is a water soluble metal salt comprising a salt based on metals of group IVA; VB; VIB; VIIB; VIII IB; IIB and IIIA of the Periodic Table of the Elements.

8. The process of claim 7 wherein the metal of the water soluble metal salt is taken from the group consisting of tin, lead, mercury, nickel, gold, silver, indium, germanium, palladium and mixtures thereof.

9. The process of claim 1 wherein the metal ion present in its lowest oxidation state (ii) is tin(II).

10. The process of claim 9 wherein the aqueous plating solution contains one or more metal salts, the metal of the metal salt being selected from the group consisting of germanium, lead, mercury, silver, indium, gold and palladium, wherein the metal ion of the metal salt is present in any oxidation state.

11. The process of claim 10 wherein the metal of the metal salt is lead.

12. The process of claim 1 wherein the complexing agent (iii) is thiourea or a substituted thiourea.

13. The process of claim 1 wherein the acid (iv) is an inorganic acid based on sulfur, phosphorous, the halogens or mixtures thereof.

14. The process of claim 13 wherein the acid (iv) is sulfuric acid or sulfamic acid.

15. The process of claim 13 wherein the acid (iv) is a mixture of sulfuric acid and hypophosphorous acid.

16. The process of claim 1 wherein the acid (iv) is an organic monocarboxylic or dicarboxylic acids having up to about six carbon atoms.

17. The process of claim 16 wherein the organic acid is taken from the group consisting of formic acid, acetic acid, malic acid, maleic acid, and mixtures thereof.

18. The process of claim 1 wherein the aqueous plating solution contains an additive selected from the group consisting of a urea compound, a reducing agent, a chelating agent, a surfactant, and mixtures thereof.

19. The process of claim 1 wherein the substrate metal surface is the surface of electrically conductive copper circuitry adhered to at least one surface of a dielectric layer support with the circuitry having a thickness of at least 4 microns.

20. The process of claim 19 wherein the free metal (i) is tin, the metal ion present in its lowest oxidation state (ii) is tin(II) ion, the complexing agent (iii) is thiourea, the acid (iv) is sulfuric acid, the metal ion present in its higher oxidation state is tin(IV) ion, and the complexed substrate metal ion is a copper(I) thiourea complex.

21. The process of claim 1 wherein the stream of the aqueous plating solution is directed onto the substrate metal surface as a spray of the solution.

22. The process of claim 1 wherein the stream of the aqueous plating solution is directed onto the substrate metal surface as a cascade of the solution.

* * * * *